(12) United States Patent
Azami

(10) Patent No.: US 7,033,070 B2
(45) Date of Patent: Apr. 25, 2006

(54) METHOD AND APPARATUS FOR MEASURING TEMPERATURE

(75) Inventor: Takeshi Azami, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/258,960

(22) PCT Filed: Jun. 21, 2001

(86) PCT No.: PCT/JP01/05325

§ 371 (c)(1),
(2), (4) Date: Oct. 30, 2002

(87) PCT Pub. No.: WO02/01170

PCT Pub. Date: Jan. 3, 2002

(65) Prior Publication Data

US 2003/0142722 A1    Jul. 31, 2003

(30) Foreign Application Priority Data

Jun. 26, 2000    (JP) .............................. 2000-191441

(51) Int. Cl.
*G01J 5/00* (2006.01)
*G01K 13/00* (2006.01)

(52) U.S. Cl. ...................... 374/131; 374/130; 374/121; 374/141; 117/201

(58) Field of Classification Search ................ 374/127, 374/128, 130, 131, 121, 141, 120; 117/14, 117/15, 38, 39, 49, 201, 202, 203, 219, 50
See application file for complete search history.

(56) References Cited

U.S. PATENT DOCUMENTS

| | | | | |
|---|---|---|---|---|
| 3,639,718 A | * | 2/1972 | Xastonguay et al. ........ | 117/202 |
| 3,761,677 A | * | 9/1973 | Mizutani et al. ............ | 117/222 |
| 4,239,583 A | * | 12/1980 | Hatch et al. ................ | 117/202 |
| 4,619,811 A | * | 10/1986 | Nishizawa .................. | 117/202 |
| 4,956,334 A | * | 9/1990 | Oka et al. ................... | 505/451 |
| 4,997,286 A | * | 3/1991 | Fehrenbach et al. ........ | 374/131 |
| 5,089,238 A | * | 2/1992 | Araki et al. ................ | 117/202 |
| 5,154,512 A | | 10/1992 | Schietinger et al. | |
| 5,223,078 A | * | 6/1993 | Maeda et al. ............... | 117/202 |

(Continued)

FOREIGN PATENT DOCUMENTS

EP        0 898 158 A2    2/1999

(Continued)

*Primary Examiner*—Diego Gutierrez
*Assistant Examiner*—Mirellys Jagan
(74) *Attorney, Agent, or Firm*—Foley & Lardner LLP

(57) ABSTRACT

Temperature of molten silicon 1 in an infrared image furnace 2 including a halogen lamp 8 as a heating source to grow a single crystal of silicon in a floating-zone method is measured with high precision according to light radiated from the molten silicon 1. By disposing an optical path tube extending to the molten silicon 1, light propagating from the molten silicon 1 in a particular direction can be extracted. As a result, light radiated from the molten silicon 1 can be extracted while reducing the influence of disturbance of light from various directions such as light radiated from the halogen lamp 8, reflected light and scattered light thereof, and the like. Luminance of light thus extracted is measured by a CCD camera 7 to obtain the temperature according to the luminance, and hence the temperature can be measured with high precision using a measuring apparatus of a simple configuration.

5 Claims, 3 Drawing Sheets

U.S. PATENT DOCUMENTS

| | | | |
|---|---|---|---|
| 5,225,883 A * | 7/1993 | Carter et al. | 374/124 |
| 5,316,385 A * | 5/1994 | Thomas | 374/130 |
| 5,463,222 A * | 10/1995 | Lesko et al. | 374/124 |
| 5,746,828 A * | 5/1998 | Boulaev | 117/201 |
| 5,785,426 A * | 7/1998 | Woskov et al. | 374/126 |
| 6,074,087 A * | 6/2000 | Chen et al. | 374/129 |
| 6,109,783 A | 8/2000 | Dobler et al. | |
| 6,153,007 A * | 11/2000 | Nakata | 117/11 |
| 6,187,090 B1 * | 2/2001 | Maeda et al. | 117/202 |
| 6,354,733 B1 * | 3/2002 | Glasheen et al. | 374/131 |
| 6,530,687 B1 * | 3/2003 | Suzuki et al. | 374/131 |
| 6,682,216 B1 * | 1/2004 | Small IV et al. | 374/126 |

FOREIGN PATENT DOCUMENTS

| | | | | |
|---|---|---|---|---|
| JP | 57026721 A * | 2/1982 | | 374/131 |
| JP | 62-123325 A | 6/1987 | | |
| JP | 63107888 A * | 5/1988 | | |
| JP | 4-204023 A | 7/1992 | | |
| JP | 4-254488 A | 9/1992 | | |
| JP | 9-165296 A | 6/1997 | | |
| JP | 10-142063 A | 5/1998 | | |
| JP | 10-185695 A | 7/1998 | | |
| JP | 2000-146700 A | 5/2000 | | |

* cited by examiner

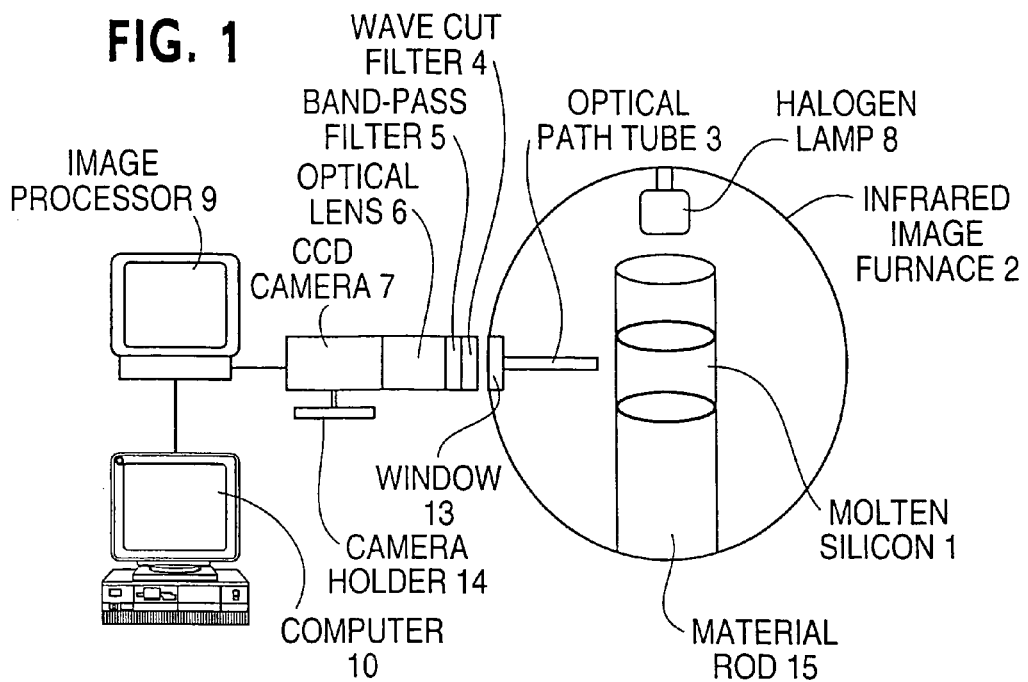
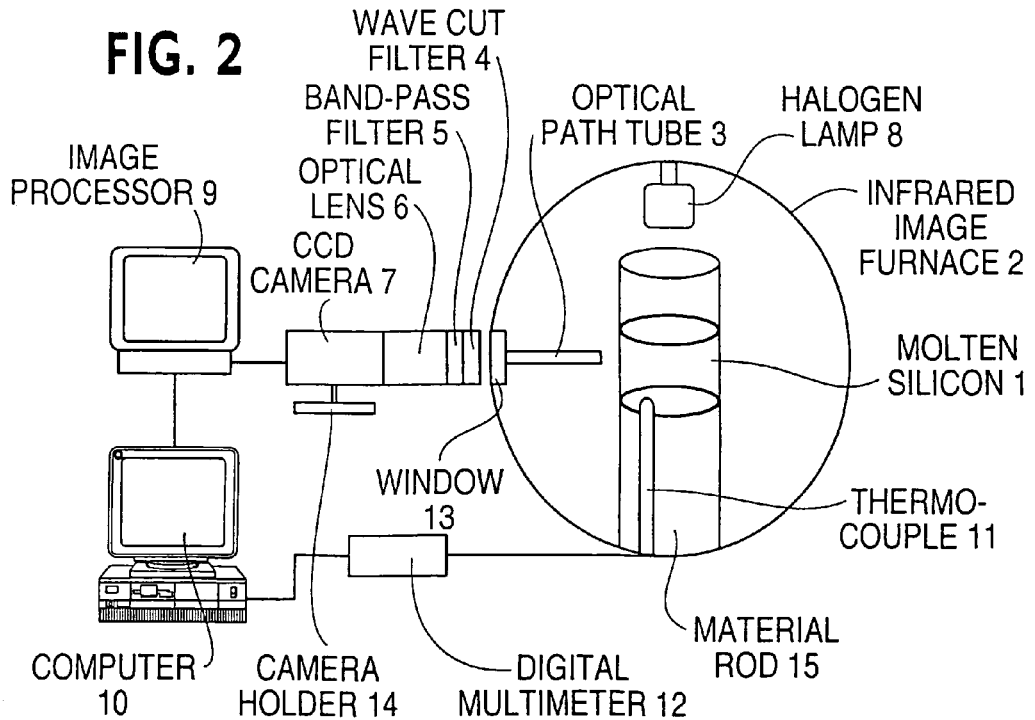

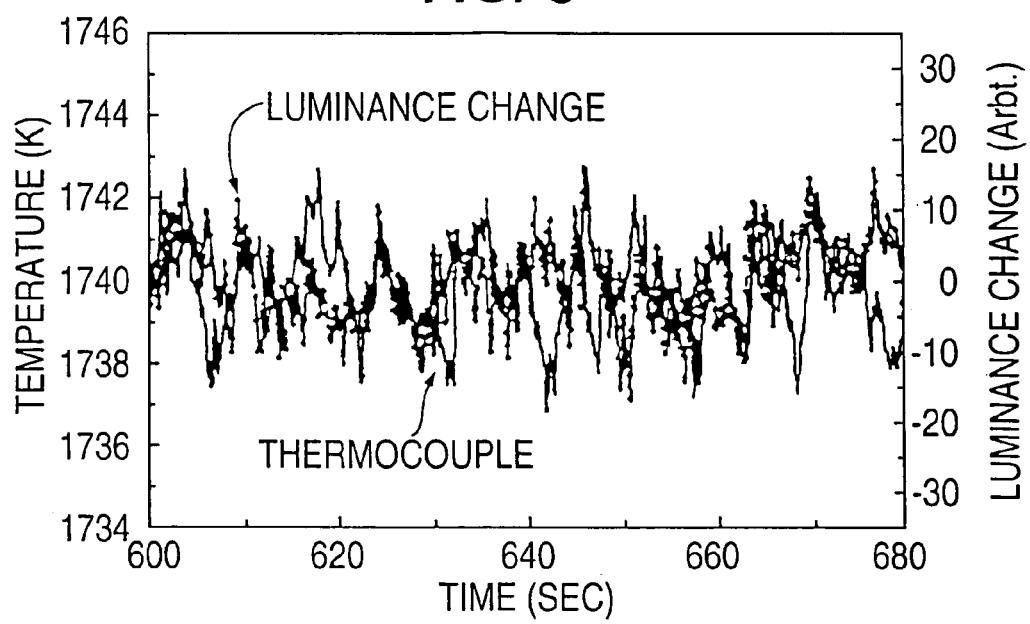
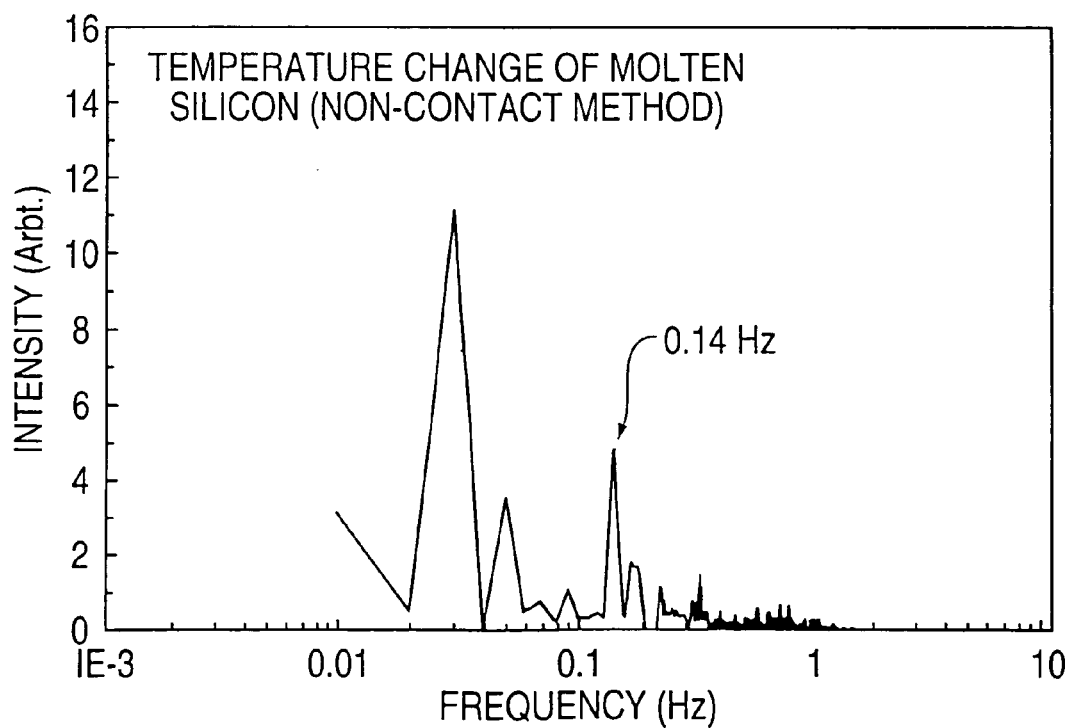

METHOD AND APPARATUS FOR MEASURING TEMPERATURE

TECHNICAL FIELD

The present invention relates to a non-contact type temperature measuring apparatus used for forming a semiconductor device using radiant heating from a heating source with high luminance such as an infrared halogen lamp, especially employed in a device to form a crystal such as single-crystalline silicon and single-crystal oxides using a floating zone method (FZ), an infrared annealing furnace for a semiconductor substrate, an infrared epitaxial furnace, and the like.

RELATED ART

Today, single-crystalline silicon used as a substrate material of a power device or the like is manufactured primarily using the zone floating (FZ) method. This is a method in which a rod of polycrystalline silicon as a source material is locally melted to form a floating zone and single-crystalline silicon is manufactured using a property that molten silicon in the floating zone forms a single crystal following on a seed crystal. In the FZ method, the molten silicon is held by surface tension and the like to form a floating zone. Therefore, from when silicon is melted to molten silicon to when the single crystal is formed as a solid state, the molten silicon is not brought into contact with any members such as a container excepting ambient gas in the furnace. In consequence, when compared with a Czochralski method (CZ method) or the like in which silicon is melted in a container such as a quartz crucible, the FZ method is advantageous in that the single-crystal silicon can be manufactured with higher purity.

For the FZ method, to increase quality of the single crystalline silicon by managing and controlling growth thereof with high precision, there has been required a method of correctly measuring surface temperature of silicon in the floating zone in a non-contact method.

Problem to be Solved by the Invention

However, for the measurement of the surface temperature of molten silicon (melting point is 1420° C.) as a high-temperature liquid, a technique to measure temperature in a non-contact method in which the temperature is measured by sensing light radiated from the surface has not been fully established. This is because the molten silicon has a high reflection factor. In other words, when it is desired to measure light radiated from a surface of molten silicon in the floating zone in the FZ method, high-luminance light radiated from a high-frequency light source such as a heating coil in an FZ furnace reflected on a surface wall formed in a state of a mirror surface to form a reflection image and the image is again reflected on the surface of molten silicon in the floating zone, and the reflected light becomes a disturbance against the original, radiated light corresponding to the temperature of the molten silicon, which makes it difficult to sense the information of the temperature.

Therefore, conventionally, as a method of measuring the temperature of molten silicon in the floating zone in the FZ furnace, there has been adopted an indirect temperature measuring method in which a thermocouple sealed in a quartz tube is brought into contact with a heat source to measure the temperature to estimate the temperature of molten silicon according to results of the measurement. In such an indirect measuring method, it is difficult to correctly measure the temperature in the silicon floating zone.

Moreover, as a method to measure temperature of a single crystal grown in the CZ method, Japanese Patent Laid-Open Publication No. SHO 59-227797 proposes a method to measure in a CZ furnace, heater temperature, molten-crystal temperature, and boundary temperature between a molten crystal and a crystal using a thermocouple to measure a gradient of the temperature in the crystal according to the results of the measurement. However, it is difficult to apply this method to the FZ method, and there is a fear that the purity of single-crystal silicon is lowered by using the thermocouple.

There has been known an event associated with the CZ method, that is, when the single crystal is grown by drawing the single crystal upward from molten silicon, there appears a ring-shaped high-luminance zone around the growing section of the single crystal. To increase yield of the products, there have been proposed the methods to measure a crystal growing state, utilizing this phenomenon, which are a method to by obtaining the high-luminance zone by a charge-coupled device (CCD) camera using the event such as a method to measure a diameter of the crystal (Japanese Patent Laid-Open Publication No. SHO 63-100097), a method to measure width of deflection of the crystal (Japanese Patent Laid-Open Publication No. SHO 63-170296), a method to measure height of surface of molten crystal (Japanese Patent Laid-Open Publication No. HEI 2-102187), and a method to measure vibration of surface of molten crystal (Japanese Patent Laid-Open Publication No. HEI 4-12233).

Also in the CZ method, to measure the temperature by sensing, by a CCD camera or the like as above, light radiated from a surface, the light radiated from the heater to melt silicon becomes disturbance. Therefore, it is required to carry out complicated correction and hence it is difficult to correctly measure the temperature. To cope with this difficulty, Japanese Patent Laid-Open Publication No. HEI 10-142063 proposes a method in which the influence of the disturbance of the light is removed by simple correction using the event of occurrence of the ring-shaped high-luminance zone as described above. However, this method uses the above-mentioned event unique to the CZ method and hence cannot be applied to the FZ method.

It is therefore an object of the present invention to provide a non-contact temperature measuring apparatus to measure temperature of a surface of a substance by sensing, with a CCD camera or the like, the light radiated from the surface of the substance, the apparatus being also capable of measuring temperature of molten silicon in the FZ method with high precision.

DISCLOSURE OF THE INVENTION

To achieve the above object according to the present invention, there is provided a non-contact type temperature measuring apparatus to measure the temperature of a heated substance in a furnace including a high-luminance light source from the luminance obtained by measuring light radiated from the heated substance, characterized by comprising a window section to transmit light from the furnace to an external space, an optical path tube extending from the window section to the heated substance, and an image receiver to measure light introduced from the heated substance via the optical path tube and the window section.

According to the configuration, by using an optical path tube, it is possible to extract the light radiated from the heated substance, propagating in a particular direction. It is therefore possible that the influence of the disturbance of light from various directions such as light radiated from the high-luminance light source, reflected light thereof, and scattered light thereof can be lowered to extract light radiated from the heated light to thereby measure temperature with high precision.

In the temperature measuring apparatus according to the present invention, the temperature can be appropriately measured in the furnace of the floating-zone method of the prior art in which a material is melted by a high-luminance light source as a heat source to generate a floating zone to grow a crystal and in which the temperature cannot be easily measured in a non-contact method. Moreover, the temperature of molten silicon for which the disturbance of the light easily occurs because of its high reflection factor can be appropriately measured.

As a material of the optical path tube, carbon is preferably used because carbon is highly resistive against high temperature and has a high light absorption factor and it is possible to suppress the occurrence of the scattered light as the disturbing light in the optical path tube. As the image receiver, a CCD camera capable of measuring luminance with high precision can be suitably employed.

In the image receiver, it is favorable to dispose a wavelength cut filter to interrupt a light in a range of wavelengths corresponding to those of light radiated from the high-luminance light source. By arranging the wavelength cut filter, the influence of reflected light of the light radiated from the high-luminance light source can be efficiently reduced. In addition, a band-pass filter to extract the light in a range of wavelengths corresponding to those of the light for which the image receiver has high sensitivity is desirably disposed in the image receiver. By arranging the band-pass filter, the influence of disturbing the light with various wavelengths caused by scattering and the like of the reflected light of the light radiated from the high-luminance light source can be efficiently minimized.

As a material of the window section, quartz can be used. If sapphire is adopted as the material of the window section, the temperature can be measured with higher precision because sapphire is a substance having a relatively high value of transmittance for light in an infrared range used for the temperature measurement.

According to the present invention, there is provided a temperature measuring method of measuring temperature of a heated substance in a furnace including a high-luminance optical source as a heating source, characterized by comprising a step of introducing light from the heated substance via an optical path tube extending to the heated substance, a step of measuring luminance of the light introduced via the optical path tube, and a step of calculating temperature of the heated substance according to the luminance.

BRIEF DESCRIPTION OF THE DRAWINGS

FIG. 1 is a schematic diagram showing a temperature measuring apparatus in an embodiment of the present invention.

FIG. 2 is a schematic diagram showing an apparatus in which a thermocouple is disposed to the apparatus of FIG. 1 for experiments.

FIG. 3 is a graph showing results of temperature measurements by the temperature measuring apparatus of FIG. 2.

FIG. 4 is a graph showing a Fourier spectrum of the graph of FIG. 3 according to results of temperature measurement by a CCD camera.

BEST MODE FOR CARRYING OUT THE INVENTION

Figure 5:
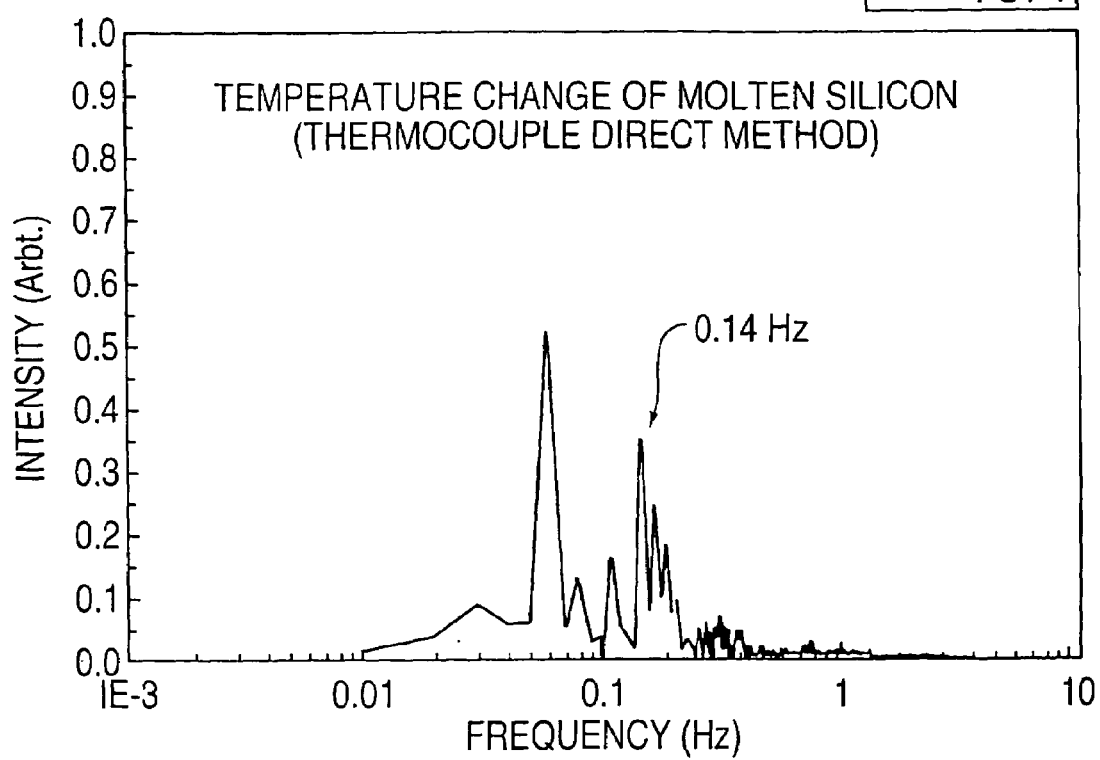
FIG. 5 is a graph showing a Fourier spectrum of the graph of FIG. 3 according to results of temperature measurement by a thermocouple.

Next, an embodiment of the present invention will be described by referring to the drawings.

FIG. 1 shows a schematic diagram of a non-contact temperature measuring apparatus of the embodiment in which the present invention is applied to an infrared image furnace 2 to manufacture single-crystal silicon in the FZ method.

First, description will be given of a configuration of the infrared image furnace 2 to manufacture single-crystalline silicon.

In the infrared image furnace 2, a halogen lamp 8 is disposed as a heating light source and a silicon raw material rod 15 is set. The furnace 2 has an inner surface formed as a mirror surface by plating gold such that the light radiated from the halogen lamp 8 is reflected on the surface to be concentrated onto a particular area of the material rod 15. In this way, by concentrating the heating light onto the particular area of the rod 15, a temperature gradient occurs in the raw rod 15, and the particular area of the rod 15 is melted to molten silicon 1 to thereby generate a floating zone.

A single crystal of silicon is manufactured in the FZ method in which the floating zone is first generated in the vicinity of a seed crystal and the floating zone is moved to sequentially grow a single crystal beginning at the seed crystal. FIG. 1 does not show details of a mechanism to move the rod 15, a mechanism to regulate ambient gas in the furnace, and the like necessary for the manufacturing.

Incidentally, silicon has a melting point of about 1420° C., and as the halogen lamp 8 to heat the rod 1, a lamp resistive against temperature up to about 3000° C. is used.

Next, description will be given of a configuration of a temperature measuring apparatus according to the present invention.

In the infrared image furnace 2, a window section 13 is disposed on a wall to pass light therethrough, the wall being on a side of a heating light concentration area, namely, of a section in which molten silicon 1 is generated. In the furnace 2, an optical path tube 3 is disposed to extend from the window section 13 to an area in which the molten silicon 1 is generated. Outside the furnace 2, there is disposed a CCD camera 7 to sense the light which is radiated from the molten silicon 1 and which is introduced via the optical path tube 3 and the window section 13 such that the attitude of the camera 7 is adjusted by a camera holder 14. In the CCD camera 7, there is mounted an optical lens 6 including a wavelength cut filter 4 to interrupt the light in a particular range of wavelengths and a band-pass filter 5 to extract the light in a particular range of wavelengths. The CCD camera 7 is connected to an image processor 9 to extract a variation in luminance from the CCD camera's output signal to output the variation therefrom. The image processor 9 is connected to a computer 10 which accumulates its output signal from the processor 9 to analyze the signal.

As described above, heretofore, when it is desired that the light radiated from the molten silicon 1 is measured to obtain the temperature of the molten silicon 1 through the measurement in the prior art, the light radiated from the halogen lamp 8 as a heat source and the reflected and scattered light thereof become disturbance, and the light cannot be correctly measured and hence it is difficult to obtain the temperature of the molten silicon 1. In this situation, the present inventor considered that by obtaining the light radiated from the molten silicon in a particular direction by use of the optical path tube 3, the light radiated from the molten silicon 1 can be extracted while lowering the influence of disturbing light coming from various directions. The temperature measuring apparatus according to the present invention is characterized in that such an optical path tube 3 is disposed therein.

Moreover, the light radiated from the halogen lamp 8 has a wavelength up to about 15 micrometers (μm) with a peak of about one micrometer. Therefore, to reduce the influence of the light, a wavelength cut filter 4 is employed to interrupt the light of a long wavelength ranging from about 1.0 μm to about 15.0 μm, namely, from a near-infrared light to a far-infrared light.

Additionally, a camera including an Si-CCD as a sensor element (768×492 pixels) having a sensing characteristic to sense light with a wavelength ranging from about 0.4 μm to about 1.1 μm is used as the CCD camera 7. In association with the sensing characteristic, a band-pass filter 5 having a maximum point of transmittance of about 0.83 μm to transmit therethrough light with a wavelength ranging from about 0.7 μm to about 1.1 μm is disposed. That is, the radiated light in a wavelength zone ranging from about 0.7 μm to about 1.0 μm is used to measure temperature. In this way, by limiting the wavelength range for the measurement to cut the light beyond the wavelength, it is possible to reduce the influence of the disturbance of light with various wavelengths caused by scattering on a surface of the molten silicon 1 or the like.

The optical path tube 3 is used in the vicinity of the molten silicon 1 at a temperature of about 1420° C. and is hence favorably made of a material resistive against temperature equal to or more than this temperature. Furthermore, to prevent an event in which light from various directions such as scattered light resultant from scattering of the light radiated from the halogen lamp 8 on a surface of the molten silicon 1 is reflected in the optical path tube 3 and reaches the CCD camera 7 to cause the disturbance in a sensed image, the tube 3 is favorably made of a material which does not easily reflect light. Therefore, in the present invention, carbon is used as the material of the tube 3 because carbon is resistive against temperature up to about 1500° C. and has a relatively high absorption of light. Alternatively, SiC or the like may also be used.

In the embodiment, the optical path tube 3 has a diameter of about 10 millimeters (mm). However, to set the temperature distribution in the infrared image furnace 2 to a possibly uniform state, it is desirable to possibly minimize the size of the optical path tube 3. In principle, even if a carbon tube having a diameter of about several nanometers (nm=$10^{-9}$ m) is used as the optical path tube 3, the variation in the luminance can be sensed by the CCD camera 7 to measure the temperature.

Although a quartz glass is generally used as the material of the window section 13, sapphire is used in the embodiment. As a result of inventor's research of the present invention, it has been confirmed that the transmittance of light in an infrared range used for the temperature measurement can be increased by using sapphire. Use of sapphire in the window section 13 is efficient to measure temperature with a temperature resolution of 1° C. or less in a high-temperature range exceeding 1420° C.

For the comparison and the verification of the results of the measurement by the temperature measuring apparatus according to the present invention as described above, an experiment is conducted in an arrangement in which a thermocouple 11 including platinum and a platinum-rhodium alloy is disposed in the apparatus of FIG. 1, the thermocouple being in contact with the molten silicon 1 as shown in FIG. 2. That is, since the temperature of the molten silicon 1 can be relatively correctly measured by using the thermocouple 11, the validity of the results of the measurement by the temperature measuring apparatus of the present invention can be evaluated by making a check to determine whether or not the results match those of this measurement by the thermocouple 11. Incidentally, the thermocouple 11 as above lowers purity of the molten silicon 1 when the thermocouple 11 is mounted. Therefore, the thermocouple 11 is not suitable for practical uses. A signal of temperature measured by the thermocouple 11 is inputted via a digital multimeter 12 to the computer 10.

FIGS. 3 to 5 show the results of the temperature measurement of temperature by the above apparatus in which a silicon floating zone having a height of 10 mm and a diameter of 10 mm is generated to measure the temperature of the molten silicon 1. FIG. 3 is a graph in which a solid line indicates variation in the temperature measured by the thermocouple (thermocouple method) and dots represent variation in temperature measured by the temperature measuring apparatus according to the present invention (non-contact method). In this regard, variation in luminance of the results measured in the non-contact method is represented using the ordinate on the right side. FIGS. 4 and 5 are graphs showing Fourier spectra of temperature variation during 102.4 seconds shown in FIG. 3. FIG. 4 is a Fourier spectrum of temperature variation in the results measured in the non-contact method according to the present invention and FIG. 5 shows a Fourier spectrum of temperature variation in the results measured in the thermocouple method.

It is clearly seen from FIG. 3 that the measured results of the non-contact method according to the present invention satisfactorily match those of the thermocouple method. Furthermore, by comparing FIG. 4 with FIG. 5, it is understood that the peaks of the respective graphs satisfactorily match each other. Particularly, the position of the peak, which corresponds to a main characterization of temperature variation, appears on a higher frequency side and is a position of about 0.14 Hz in both graphs. It is appreciated from this event that the non-contact temperature measuring apparatus according to the present invention can measure the variation in temperature of the molten silicon in the floating zone with high precision.

INDUSTRIAL APPLICABILITY

As described above, the temperature measuring apparatus of the present invention is a relatively simple apparatus configured by adding an optical path tube to the ordinary non-contact temperature measuring apparatus in which by extracting by the optical path tube only the light propagating from the molten silicon in a particular direction, light radiated from the molten silicon can be extracted while reducing the influence of disturbance of light from various directions to thereby measure the temperature of the molten silicon with high precision.

The temperature measuring apparatus of the present invention can be suitably used particularly to measure the temperature of the molten silicon in a furnace growing a single crystal using the FZ method and can also be suitably used to measure the temperature in an infrared annealing furnace, an infrared epitaxial furnace, or the like in which a heating process is conducted using high-luminance light.

The invention claimed is:

1. A temperature measuring method of measuring temperature of a heated substance in a furnace in which crystals are grown using a floating zone method including a high-luminance light source as a heating source, comprising the steps of:

illuminating said heated substance with a high luminance light source comprising a halogen lamp having a peak wavelength of about 1 micrometer;

introducing light to a temperature measuring apparatus from the heated substance via an optical path tube made of carbon and extending to the heated substance said optical path tube extending substantially horizontally of said heated substance, measuring luminance of the light introduced via the optical path tube using an image receiver comprising a CCD camera, filtering light entering the CCD camera with a wave length cut filter to interrupt light in a predetermined wavelength range from about 1.0 to about 15.0 micrometers;

further filtering light entering the CCD camera with a band-pass filter to extract substantially all light in a predetermined wavelength range from about 0.7 to about 1.1 micrometers; and calculating temperature of the heated substance according to the luminance.

2. A temperature measuring apparatus for non-contact temperature measurement of a heated substance in a furnace in which a crystal is grown using a floating-zone method by measuring luminance of a light radiated from the heated substance to obtain the temperature, said furnace using a high luminance light source comprising a halogen lamp having a peak wavelength of about 1 micrometer for heating said substance and said substance generating said light as a result of said heating, said temperature measuring apparatus comprising:

a window section to transmit the light from the furnace to an external space, an optical path tube made of carbon and extending from the window section to the heated substance said tube having a distal end positioned laterally adjacent said heated substance and extends substantially horizontally to said window section, an image receiver to receive the light introduced from the heated substance via the optical path tube to the window section and the external space; and a measurement device for measuring the luminance of said received light as a measure of the temperature;

wherein:

the image receiver comprises a CCD camera;

the image receiver includes a wave length cut filter to interrupt light in a predetermined wavelength range from about 1.0 to about 15.0 micrometers; and the image receiver includes a band-pass filter to extract substantially all light in a predetermined wavelength range from about 0.7 to about 1.1 micrometers.

3. A temperature measuring apparatus according to claim 2, wherein the heated substance is molten silicon.

4. A temperature measuring apparatus according to claim 2, wherein the window section is made of quartz.

5. A temperature measuring apparatus according to claim 2, wherein the window section is made of sapphire.

* * * * *